(12) United States Patent
Dobson

(10) Patent No.: US 6,287,989 B1
(45) Date of Patent: *Sep. 11, 2001

(54) METHOD OF TREATING A SEMICONDUCTOR WAFER IN A CHAMBER USING HYDROGEN PEROXIDE AND SILICON CONTAINING GAS OR VAPOR

(75) Inventor: Christopher David Dobson, Bristol (GB)

(73) Assignee: Trikon Technologies Limited, Newport (GB)

(*) Notice: Subject to any disclaimer, the term of this patent is extended or adjusted under 35 U.S.C. 154(b) by 0 days.

This patent is subject to a terminal disclaimer.

(21) Appl. No.: 09/174,578

(22) Filed: Oct. 19, 1998

Related U.S. Application Data

(62) Division of application No. 08/362,429, filed on Dec. 28, 1994, now Pat. No. 5,874,367.

(30) Foreign Application Priority Data

Jul. 4, 1992 (GB) .................................................. 9214243
Oct. 14, 1992 (GB) .................................................. 9221519
Oct. 14, 1992 (GB) .................................................. 9221520

(51) Int. Cl.[7] .................................................. H01L 21/31
(52) U.S. Cl. .......................... 438/778; 438/788; 438/935; 438/790
(58) Field of Search .................................. 438/788, 778, 438/935, 787, 790, 789, 761

(56) References Cited

U.S. PATENT DOCUMENTS

| 3,822,928 | 7/1974 | Smolinsky et al. . |
| 4,096,315 | 6/1978 | Kubacki . |
| 4,397,722 | 8/1983 | Haller . |
| 4,494,303 | 1/1985 | Celler et al. . |
| 4,759,993 | 7/1988 | Pai et al. . |
| 4,781,942 | 11/1988 | Leyden et al. . |

(List continued on next page.)

FOREIGN PATENT DOCUMENTS

| 0382932 A2 | 8/1989 | (EP) . |
| 0353818 | 2/1990 | (EP) . |
| 0 519 079 A1 | 12/1992 | (EP) . |
| 0568235 A1 | 11/1993 | (EP) . |
| 0726 599 A2 | 8/1996 | (EP) . |
| 0743675 A1 | 11/1996 | (EP) . |
| 2125423 A | 3/1984 | (GB) . |
| 59-57437 | 4/1984 | (JP) . |
| 61-250032 | 11/1986 | (JP) . |
| 63-110642 | 5/1988 | (JP) . |
| 2-278850 | 11/1990 | (JP) . |
| 332092 | 4/1972 | (RU) . |
| WO 94/01885 | 1/1994 | (WO) . |

OTHER PUBLICATIONS

Wolf "silicon processing for the vlsi era" vol. 1 pp. 182–183, 1989.*
Wolf "silicon processing for the vlsi era" vol. 1 pp. 182–183, 1986.*
Wolf, "silicon processing for the VLSI Era" vol. 1, pp. 182–183, 1986.*
"Novel Self–planarizing CVD Oxide for Interlayer Dielectric Applications", M. Matsuura et al., IEEE Technical Digest: International Electron Devices Meeting, Dec. 11–14, 1994, San Fransisco, CA. IEDM 94–117.

*Primary Examiner*—Charles Bowers
*Assistant Examiner*—Thanh Nguyen
(74) *Attorney, Agent, or Firm*—Jones Volentine, PLLC

(57) ABSTRACT

A semiconductor wafer is treated in a chamber by introducing into the chamber a silicon-containing gas or vapor and hydrogen peroxide in vapor form. The silicon-containing gas or vapor is reacted with the hydrogen peroxide to form a short chain, inorganic fluid polymer on the wafer, which thus forms a generally planar layer.

14 Claims, 4 Drawing Sheets

U.S. PATENT DOCUMENTS

| | | | |
|---|---|---|---|
| 4,812,325 | * 3/1989 | Ishihara et al. | 427/69 |
| 5,314,724 | * 5/1994 | Tsukune et al. | 427/489 |
| 5,360,464 | 11/1994 | Morita . | |
| 5,376,591 | * 12/1994 | Maeda et al. | 438/761 |
| 5,506,008 | 4/1996 | Klumpp et al. . | |
| 5,525,550 | * 6/1996 | Kato | 438/788 |
| 5,618,745 | 4/1997 | Kita . | |
| 5,627,391 | 5/1997 | Shimada et al. . | |

* cited by examiner

METHOD OF TREATING A SEMICONDUCTOR WAFER IN A CHAMBER USING HYDROGEN PEROXIDE AND SILICON CONTAINING GAS OR VAPOR

CROSS-REFERENCE TO RELATED APPLICATIONS

This is a divisional of application Ser. No. 08/362,429, filed Dec. 28, 1994, now U.S. Pat. No. 5,874,367, the entire subject matter of which is incorporated by reference herein for all purposes, which in turn is a national stage application under 35 U.S.C. §371 of International Application No. PCT/GB93/01368, filed Jun. 30, 1993.

BACKGROUND OF THE INVENTION

1. Field of the Invention

This invention relates to a method for treating a semiconductor wafer and in particular, but not exclusively, to what is known as planarisation.

2. Description of the Related Art

It is common practice in the semi-conductor industry to lay down layers of insulating material between conducting layers in order to prevent short circuits. If a layer of insulating material is simply deposited in the normal way undulations begin to build up as the layers pass over the metallic conductors which they are designed to insulate. Various techniques have been developed to try to overcome this problem by filling the trenches or valleys between the conductors to a height above the top of the conductors so that after treatment a generally planar layer exists on the top of the wafer. One example of such a technique is to spin on layers of polyimide to smooth out the surfaces. However, in practice, narrow trenches tend to be incompletely filled whilst wide valleys are not fully leveled. As the 2-D dimensions of devices are reduced, these problems are accentuated.

SUMMARY OF THE INVENTION

One aspect the invention resides in a method of treating a semi-conductor wafer comprising, depositing a liquid short-chain polymer having the general formula $Si_x(OH)_y$ or $Si_xH_y(OH)_z$ on the wafer to form a generally planar layer.

The reference to the polymer being liquid is simply intended to indicate that it is neither gaseous nor solidified at the moment of deposition.

Another aspect the invention resides in a method of treating a semi-conductor wafer in a chamber including, introducing into the chamber a silicon-containing gas or vapour and a compound, containing peroxide bonding, in vapour form, reacting the silicon-containing gas or vapour with the compound to form a short-chain polymers on the wafer to form a generally planar layer.

The silicon-containing gas or vapour may be inorganic and preferably is silane or a higher silane, which may be introduced into the chamber with an inert carrier gas, for example nitrogen. The compound may be, for example, hydrogen peroxide or ethandiol.

The method may further comprise removing water and/or OH from the layer. For example the layer may be exposed to a reduced pressure and/or exposed to a low power density plasma, which may heat the layer to 40 to 120° C.

The method may further comprise forming or depositing an under layer prior to the deposition of the polymer. This under layer may be silicon dioxide and may have a thickness of between 1000 and 3000 Å. It may for example be 2000 Å thick. The under layer may conveniently be deposited by plasma enhanced chemically vapour deposition. Either the under layer and/or the wafer may be pretreated by, for example a plasma, to remove contaminants. In that case it may be pretreated with a plasma, for example using oxygen as a reactive gas.

Similarly the surface of the deposited polymer layer may be treated in a plasma using a reactive oxygen gas in order to enhance chain lengthening and cross-linking within the polymer. This gas could be, for example, oxygen, nitrogen or hydrogen peroxide vapour and other gases may be appropriate. The plasma has a heating effect which enhances crosslinking, but there may also be a radiation effect from the various gases. This chain linking may alternatively be catalysed by exposing the polymer layer to UV light, x-rays or ion bombardment. However, in many applications acceleration of chain linking may not be desirable; instead it may be desirable for the polymer molecule particles to settle before significant chain linking occurs.

The method may further comprise depositing or forming a capping layer on the surface of the deposited layer. This capping layer may be silicon dioxide. The capping layer is deposited after a proportion of the condensation reactions have occurred and water has been removed from the layer.

The method may further comprise heating the polymer layer and this heating preferably takes place after capping. The polymer layer may be heated to between 180–220° C. for between 50–70 minutes. For example it may be heated to 220° C. for 60 minutes. The layer may subsequently be allowed to cool to an ambient temperature and then reheated to 430–470° C. for 30–50 minutes. For example the second heating may last 40 minutes at 450° C. Indeed this second heating may suffice and may be achieved using a furnace, heat lamps, a hotplate or plasma heating.

In one preferred arrangement the polymer layer may be heated to between 200–450° C., prior to capping, in order that the cap can be deposited at elevated temperatures. Although the capping layer could be deposited in one or more steps e.g. a 'cold' capping layer deposited at the temperature of the planarising layer followed by a hot capping layer; the polymer layer having first been heated to 200–450° C. as described above.

The density of the hydrogen peroxide may be in the range of 1.20–1.35 gms/cc and a density of 1.25 gms/cc may be particularly preferred. The hydrogen peroxide is preferably at 50% concentration when introduced into the chamber.

The ambient temperature within the chamber may be within the range of 0–80° C. during the deposition of the polymer layer, but the wafer platten is preferably at 0° C. or at the dew point of the polymer when in vapour form. Low pressure is also desirable but requires low temperatures (eg 400 mT, −10° C.).

In order to avoid heating the platten, the wafer is preferably lifted from the platten for each processing step which involves heating.

The method can be used to achieve planarisation or gap filling. In the latter case the ambient chamber temperature may conveniently be even higher.

The invention also includes wafers treated by any of the methods set out above and semi-conductor devices including polymer layers formed by the method above.

BRIEF DESCRIPTION OF THE DRAWINGS

The invention may be performed in various ways and a specific embodiment will now be described, by way of example, with reference to the following drawings, in which.

DETAILED DESCRIPTION OF THE PREFERRED EMBODIMENT

Figure 1:
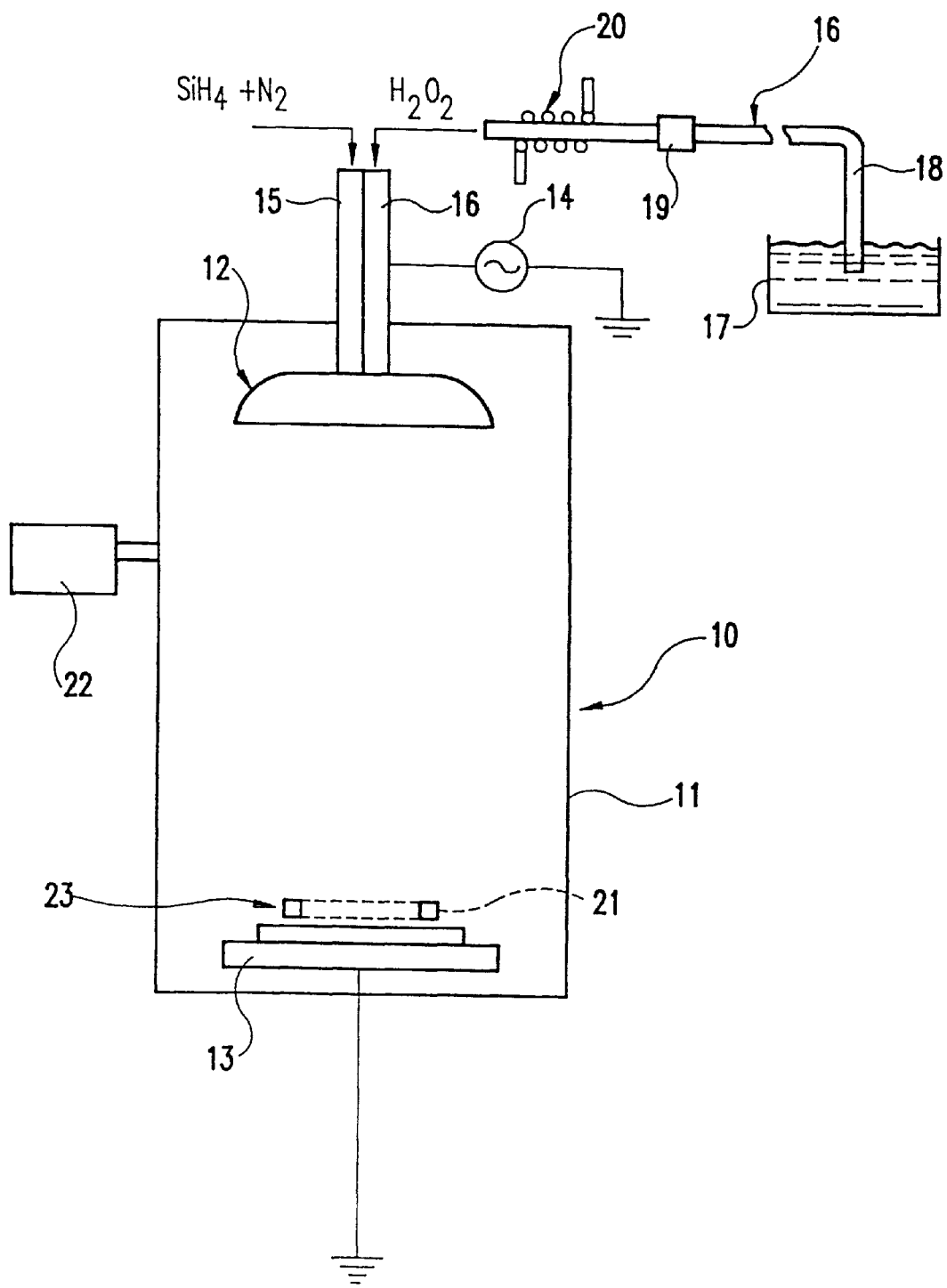
FIG. 1 is a schematic view of an apparatus for performing the treatment method.

An apparatus for treating semi-conductor wafers is schematically illustrated at 10 in FIG. 1. It will be understood that only the features which are particularly required for the understanding of the invention are described and illustrated. The general construction of such apparatus is well known in the art.

Thus, the apparatus 10 includes a chamber 11 having a duplex shower head 12 and a wafer support 13. The showerhead 12 is connected to RF source 14 to form one electrode, whilst the support 13 is earthed and forms another electrode. Alternatively the R.F. source 14 could be connected to the support 13 and the shower head 12 earthed. The shower head 12 is connected by respective pipes 15 and 16 to a source of $SiH_4$ in $N_2$ or other inert carrier and a source 16 of $H_2O_2$. The carrier gas is conveniently used for ease of operation of the equipment; it is believed that the process could be performed without it.

The source 16 comprises a reservoir 17 of $H_2O_2$, an outlet pipe 18, a pump 19 and a flash heater 20 for vaporising the $H_2O_2$.

In use the apparatus is arranged to deposit a short chain, inorganic polymer, which is initially a liquid, between the interconnects on a semi-conductor chip to produce planarisation either locally or globally, or for 'gap filling'. The polymer is formed by introducing into the chamber the silane and the hydrogen peroxide in vapour form and reacting them within the chamber spontaneously. Once the resultant polymer is deposited on the wafer, it has been found that its viscosity is such that it fills both small and large geometries or gaps and is generally self levelling. It is believed that effectively there is a settlement process taking place as the polymerization takes place. The more settlement which occurs prior to full polymerization the less likelihood there is of cracking. Very small dimensioned gaps can be filled and because of the fill layer properties these gaps can even, in certain circumstances, be re-entrant.

As has been mentioned, if left, the chains within the polymer will slowly extend and cross link. In some circumstances it may be desirable to accelerate this process by plasma treatment. This treatment produces UV radiation and it is believed that it is this radiation which is responsible for increasing the speed of chain extension and cross linking. Other forms of radiation treatment may therefore be equally applicable. A variety of gases may be appropriate for use at this stage, for example any inert gas or hydrogen, nitrogen or oxygen containing gases.

For good quality films it is desirable to remove as much water and OH from the film at an early stage. This can be done by exposing the layer to a reduced pressure causing the layer to pump water out and then subsequently heating the layer to between say 40° C. and 120° C. A pump 22 is provided for reducing chamber pressure.

However in order to solidify fully the polymer layer, it has been found that it is generally necessary to subject the layer to more intense heat treatment. In many instances it is necessary or desirable first to deposit a capping layer over the polymer. It is believed that this assists in providing mechanical stability for the polymer layer cross linking. It may also help to control the rate at which the layer looses water during heating and so have a controlling affect on shrinkage and cracking.

A suitable capping layer would be silicon dioxide.

The heat treatment stage after the capping involves removing excess water from the layer which is a by-product of the cross-linking reaction. The bake also removes SiOH bonds. The speed at which the water is removed may be important and several ways of removing water have been successful. One suitable sequence comprises baking the layer for 60 minutes at 200° C., cooling it to ambient temperature and then rebaking it for 40 minutes at 450° C. Microwave heating has also been successful. A simple bake at 450° will often also suffice, or the bakes may be replaced by the following steps:

1. 2000 Å 'cold' cap deposited at between 20–40° C.
2. Plasma heat treatment in $N_2O$ which raises the temperature to 300–400° C.
3. 4000–6000 Å 'hot' cap is deposited.

Alternatively, in some cases, a single stage 'hot cap' deposited at 300–400° C. will suffice.

It has been found that the adhesion of the polymer layer to the underlying substrate material can be enhanced by depositing an under layer, for example of silicon dioxide. Typically this should be of the order of 2000 Å thickness and it may be laid down by plasma-enhanced chemical vapour deposition.

Figure 2A:
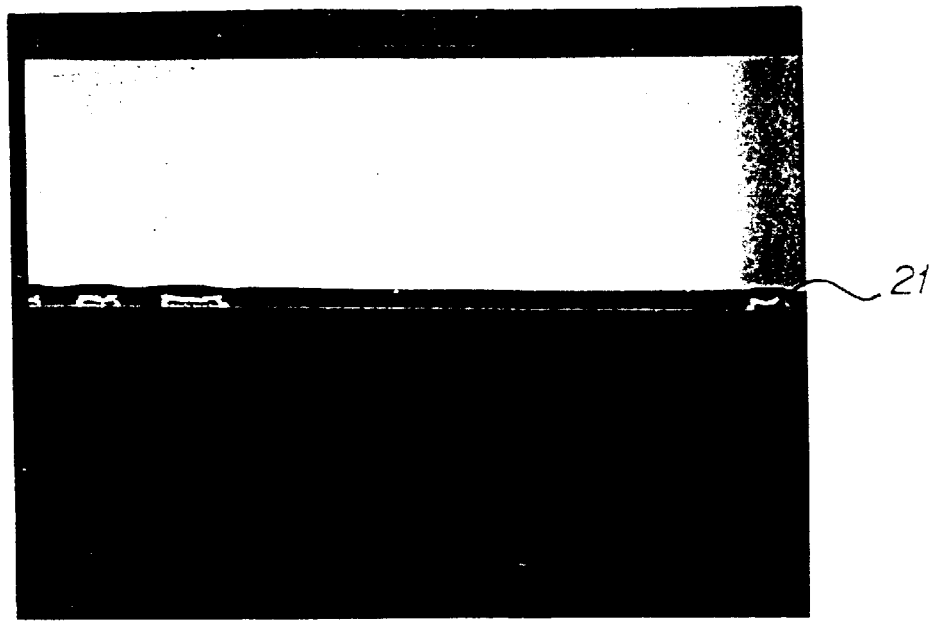
FIGS. 2A and 2B are hugely magnified photographs of cross-sections of a wafer treated by the method.
Figure 2B:
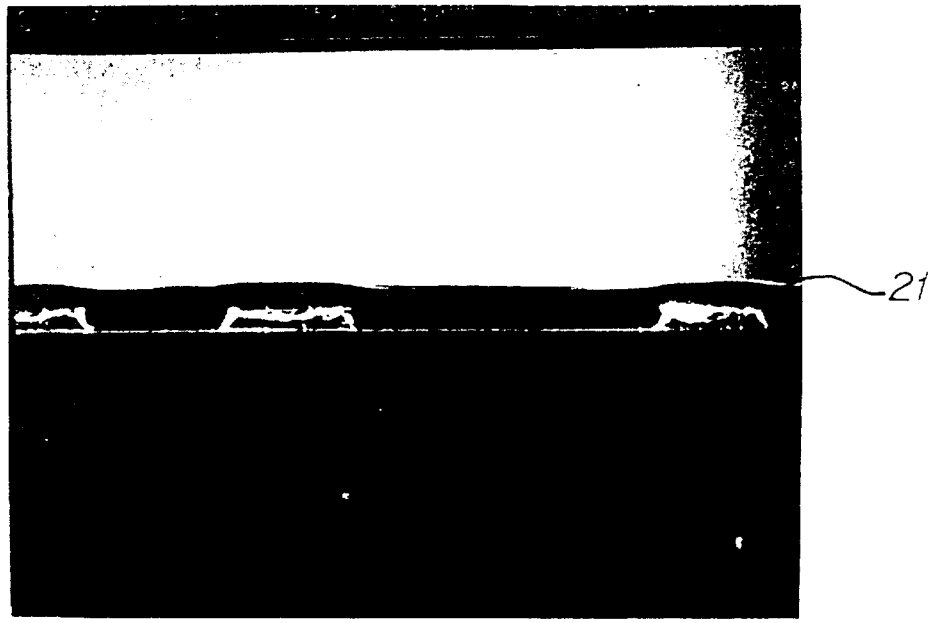

Examples of actual deposited layers are illustrated in the photographs of FIGS. 2A and 2B. It will be seen that the upper surface of the layers 21 are generally planar despite the huge magnification involved.

Although $SiH_4$ has proved to be particularly successful, it is believed that the method will be applicable with most silicon-containing gases or vapours. It has been found that to some extent a suitable polymer can be obtained with any concentration or density of $H_2O_2$, but a density range 1.20–1.35 gms/cc has been particularly successful. The most preferred $H_2O_2$ density is 1.25 gms/cc. An $H_2O_2$ concentration of 50% is very effective but it is believed that the preferred concentration may vary depending on whether the object is to achieve planarisation or gap filling. It is preferred that more $H_2O_2$ is supplied than $SiH_4$ and it is particularly preferred that the $H_2O_2$:$SiH_4$ ratio is of the order of 3:1.

In the event that the wafer needs to be removed from the chamber between processing stages, it may be desirable to pre-treat the exposed surface, when the wafer is placed back in the chamber, in order to remove any organics or other contaminants from the exposed surface.

Figure 3A:
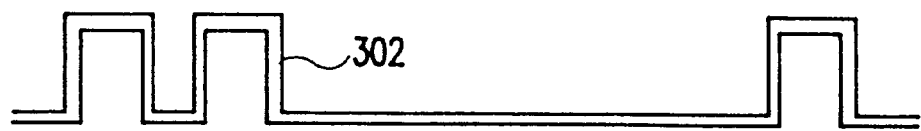
FIGS. 3A to 3E illustrate schematically the steps of the process.
Figure 3B:
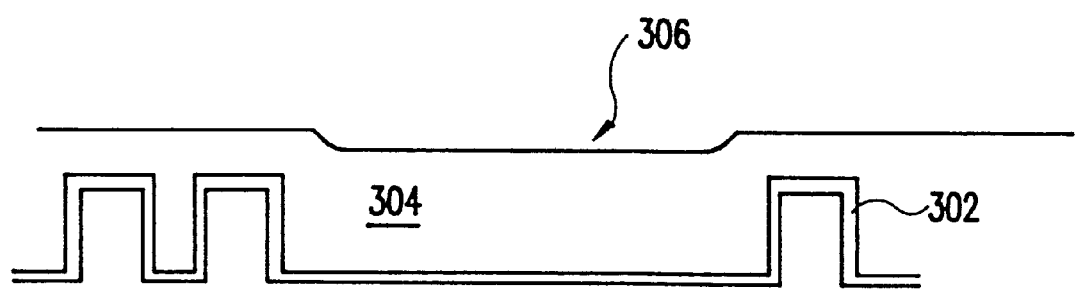
Figure 3C:
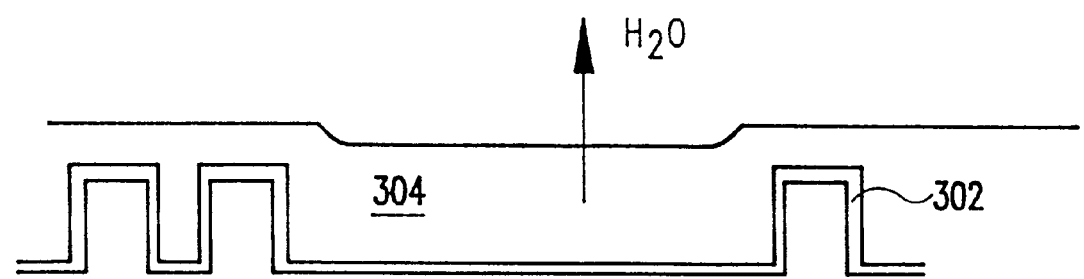
Figure 3D:
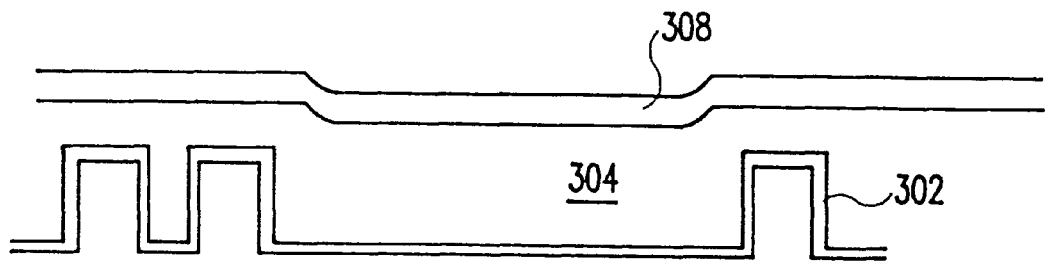
Figure 3E:
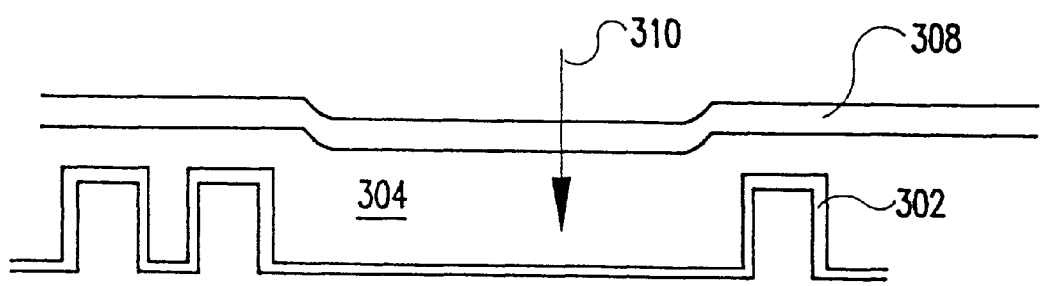

FIGS. 3A to E illustrate the preferred processing sequence schematically. FIG. 3A shows formation of the underlayer 302 (adhesion enhancer) by PECVD at 300 Deg. C., with a probably chemistry of $SiH_4 + 2N_2O \rightarrow SiO_2 \downarrow + 2H_2 + 2N_2$. FIG. 3B shows formation of the planarising layer 304 (planarises features), with reference numeral 306 denoting surface tension forces, by CVD at approx. 0 deg. C., with a probably chemistry of $SiH_4 + 3H_2O_2 \rightarrow Si(OH)_4 \downarrow + 2H_2O + H_2$. FIG. 3C shows a treatment stage, i.e., a first post treatment (promotion of polymerisation and removal of water), by pumpout at approx. 0 deg. C., and pumpout at approx. 150 deg. C., with a probable chemistry of $Si(OH)_4 \rightarrow SiO_2 \rightarrow + 2H_2O \uparrow$. FIG. 3D shows formation of the capping layer 308 (provides mechanical stability during densification step) by PECVD at 300 deg. C., with a probably chemistry of $SiH_4 + 2N_2O \rightarrow SiO_2 \downarrow + 2H_2 + 2N_2$. FIG. 3E shows a second treatment stage, i.e., a second post treatment (densification of film, where reference numeral 310 denotes shrinkage), by anneal at 450 deg. C. It may be advantageous to wash the chamber with $H_2O_2$ between at least some of the processing stages.

As it is desirable to keep the platten or support 13 at around 0° C., the wafer may be lifted above the support 13 for each heating process so that the heat of the wafer is not significantly transmitted to the support 13. This can be achieved by arranging an intermediate position 23 for a wafer loading device 21.

What is claimed is:

1. A method of treating a semiconductor wafer in a chamber comprising, introducing into the chamber a silicon-containing gas or vapour and hydrogen peroxide in vapour form, reacting the silicon-containing gas or vapour with the hydrogen peroxide to form a short chain, inorganic fluid polymer on the wafer which forms a generally planar layer.

2. A method as claimed in claim 1, wherein the silicon-containing gas or vapour is $SiH_4$.

3. A method as claimed in claim 1, further comprising forming an under layer on the wafer prior to formation of the polymer.

4. A method as claimed in claim 3, wherein the under layer is silicon dioxide.

5. A method as claimed in claim 3, wherein the under layer is between 1000 and 3000 Å thick.

6. A method as claimed in claim 4, wherein the under layer is between 1000 and 3000 Å thick.

7. A method as claimed in claim 1, further comprising treating the polymer in a reactive oxygen gas to enhance chain lengthening and cross-linking within the polymer.

8. A method as claimed in claim 1, further comprising exposing the polymer to at least one of UV light, x-rays and ion bombardment to catalyze chain linking within the polymer.

9. A method as claimed in claim 1, further comprising forming a capping layer on the polymer.

10. A method as claimed in claim 1, wherein the capping layer is silicon dioxide.

11. A method as claimed in claim 9, further comprising heating the polymer after formation of the capping layer.

12. A method as claimed in claim 10, further comprising heating the polymer after formation of the capping layer.

13. A method as claimed in claim 1, wherein the silicon containing gas or vapour and the hydrogen peroxide react spontaneously within the chamber.

14. A method as claimed in claim 13, wherein the silicon-containing gas or vapour is $SiH_4$.

* * * * *